United States Patent [19]

Ward et al.

[11] Patent Number: 4,736,390
[45] Date of Patent: Apr. 5, 1988

[54] ZERO IF RADIO RECEIVER APPARATUS

[75] Inventors: Charles R. Ward, Wayne; Ning H. Lu, Parsippany, both of N.J.

[73] Assignee: ITT Avionics, a Division of ITT Corporation, Nutley, N.J.

[21] Appl. No.: 919,106

[22] Filed: Oct. 15, 1986

[51] Int. Cl.$^4$ ............................................. H03K 9/02
[52] U.S. Cl. ........................................ 375/75; 375/39; 455/315; 455/324
[58] Field of Search ........................... 375/39, 77, 75; 455/207, 209, 237, 314, 315, 324

[56] References Cited

U.S. PATENT DOCUMENTS 4,063,173 12/1977 Nelson et al. .................... 455/315
4,491,976 1/1985 Saitoh et al. ..................... 455/315

Primary Examiner—Robert L. Griffin
Assistant Examiner—Marianne Huseman
Attorney, Agent, or Firm—Robert A. Walsh; Thomas N. Twomey; Mary C. Werner

[57] ABSTRACT

There is described a zero IF receiver which affords to reduce offsets normally associated with quadrature mixers employed in such receivers. In order to reduce the effect of such offsets the local oscillator signal is modulated with a balanced pseudo-random phase code signal. This signal is then stripped off by means of additional mixers, one for each of the quadrature channels. The effect of the pseudo-random phase code signal is to spread the spectrum which is associated with the offsets so that the receiver can now respond to desired signals with a minimum of interference.

10 Claims, 3 Drawing Sheets

ZERO IF RADIO RECEIVER APPARATUS

BACKGROUND OF THE INVENTION

This invention relates to radio receiver apparatus and more particularly to a radio receiver employing a zero intermediate frequency (IF) design.

Zero IF type receivers are well known in the prior art and essentially a zero IF type receiver skips the step of going to an IF frequency and instead converts the desired incoming signal directly to baseband in a single operation. In addition to the economy of direct conversion there are performance advantages particularly for multiple function radio receivers. To date, the zero IF type receiver has found only limited use, primarily due to the problems resulting from DC offsets present at the output of balanced mixer circuits which are caused by imperfections in their performance.

In any event, as indicated above, the zero IF approach has been widely described in the prior art. U.S. Pat. No. 4,238,850 issued on Dec. 9, 1980 to I. W. Vance and is entitled Transmitter/Receiver for Single Channel Duplex Communication System describes a transmitter receiver which can be used for a cordless telephone. The receiver produces direct conversion from the radio frequency. The local oscillator frequency is modulated by an audio signal to be sent, the modulated signal being passed through a dual splitting and combining network. As described in this patent, the receiver makes use of the zero IF or direct conversion method of demodulation. Such a method is also described in British specification Ser. No. 1530602 published Nov. 1, 1978 to I. A. W. Vance.

U.S. Pat. No. 4,470,147 entitled Radio Receiver with Quadrature Demodulation and Digital Processing issued on Sept. 4, 1984 to J. K. Goatcher and is assigned to the International Standard Electric Corp. This patent depicts a radio receiver which divides the radio frequency input into two channels and in each channel mixes it with the carrier wave frequency. A quadrature shift in a mixed carrier wave frequency enables baseband signals to be filtered from the mixer outputs.

Essentially, the analog quadrature signals are converted to digital form and processed digitally to reproduce the original modulating signal for AM/FM or PM transmissions. For single sideband modulation, the mixing frequency is the sideband center frequency instead of the carrier frequency.

U.S. Pat. No. 4,476,585 entitled Baseband Demodulator for FM Signals issued on Oct. 9, 1984 to J. Reed and is assigned to the International Telephone and Telegraph Corp. This patent shows a modulator which is employed in the zero IF system and uses a local oscillator for providing quadrature output signals at the center frequency of an FM signal to be demodulated. The demodulator has first and second mixers for separately mixing the FM signal with the quadrature signal to provide a first and second output signal, each in quadrature at the outputs of the mixers. These signals are lowpass filtered. A demodulator shown which includes third and fourth mixers with each mixer receiving at an input the output of one lowpass filter. At another input, the mixers receive the third and fourth signals. The third and fourth signals are derived from mixing a variable controlled oscillator signal with a local oscillator quadrature signal.

Essentially, the patent also shows the switching circuit which operates to alternate the third and fourth signals as applied to the input of the third and fourth mixer as well as the output as applied to the difference amplifier and uses an additional amplifier coupled to the outputs of the mixers so that one can utilize automatic gain control in a Zero IF system.

Hence as indicated, the prior art is fully cognizant of the zero IF technique and is further evidence by other U.S. Pat. Nos. which are as follows. U.S. Pat. No. 4,540,958, U.S. Pat. No. 4,476,585, U.S. Pat. No. 4,480,327, U.S. Pat. No. 4,462,107, U.S. Pat. No. 4,488,064, U.S. Pat. No. 4,506,262, U.S. Pat. No. 4,521,892, U.S. Pat. No. 4,525,835, U.S. Pat. No. 4,322,851 and U.S. Pat. No. 4,254,503.

Essentially, the main purpose of such a system is to provide a communications system wherein the amount of tuned circuitry employed is substantially reduced. In obtaining a reduction in the number of tuned circuitry, one is therefore able to integrate large portions of the receiver and produce radio receivers which are extremely compact and reliable. These receivers as indicated may be employed in many areas such as in selective paging systems and so on. Thus to achieve such advantages, the design of such receivers is implemented according to the zero IF technique.

As indicated in such a system, there is present a receiver in which the local oscillator signals are in phase quadrature at the carrier frequency and are each separately mixed with the incoming audio modulated signals. The resultant signals have a zero IF with the two sidebands folded over on each other at the baseband and extending in frequency from DC to the single sideband wave of the original signal. As one can see from the above cited references, the concentration has mainly been in regard to implementing receiver design or a transceiver design utilizing baseband circuitry.

As indicated, baseband circuitry operates at frequencies where integrated circuit technology is well established, and therefore a transceiver which consists primarily of integrated circuits is relatively small and inexpensive. It is, of course, a desire of the prior art to obtain improved performances from the receiver. A major difficulty which arises with conventional zero IF receivers architecture revolves around the DC offsets which are present at the output of the quadrature mixers. These offsets, on the order of millivolts, in the presence of generally much smaller desired signals, causes the low noise baseband amplifiers to saturate before the desired signals could be amplified efficiently to interface with the analog-to-digital converters. One potential method of overcoming this problem is to AC couple the output of the channel filter into the baseband amplifier. This introduces another problem, however, since the DC notch will result in poor transient performance in the presence of pulsed jammers. For some signal modulation types such as DSB (amplitude modulation, double sideband, suppressed carrier), broadening the notch width improves the transient response duration without degrading performance but for many other formats (such as FM and SSB) this results in distortaion, since the notch frequencies contain signal information.

A similar situation occurs for the case of frequency hopping since the DC offsets are different for each frequency. When the hopping rate is fast, this results in significant AC components in the offsets which require a broadening of the notch cutoff frequency. In fact, the notch cutoff frequency may have to be broadened to the point where significant signal distortaion can occur.

Hence, as one can ascertain, although there are many good reasons for utilizing the zero IF receiver, there are difficulties in regard to the performance of the same.

It is, therefore, an object of the present invention to provide an improved zero IF receiver which circumvents many of the problems of prior art devices.

BRIEF DESCRIPTION OF THE PREFERRED EMBODIMENT

A zero IF receiver apparatus for receiving an RF signal and providing an amplified version of said signal to be applied to a first and a second quadrature channel, said receiver including a local oscillator source for converting said RF signal in each channel to a baseband signal, comprising first and second mixers each having one input adapted to receive said amplified RF signal, and each having a second input and an output, said mixers undesirably exhibiting an interfering DC offset, a pseudo-random phase code source for providing at an output a pseudo-random phase signal, third and fourth mixers each having one input coupled to the output of said pseudo-random phase code source and a second input coupled to the output of said local oscillator source wherein said third mixer receives at its input said local oscillator signal at a phase shift of 90° from said fourth mixer local oscillator signal, with the output of said third mixer coupled to the second input of said first mixer, and the output of said fourth mixer coupled to the second input of said second mixer, first and second filter means with said first filter means having an input coupled to the output of said first mixer and said second filter means having an input coupled to the output of said second mixer, fifth and sixth mixers with said fifth mixer having a first input coupled to the output of said first filter means and a second input coupled to said pseudo-random phase code source, with said sixth mixer having a first input coupled to the output of said second filter means and a second input coupled to said pseudo-random phase code source to provide at the outputs of said fifth and sixth mixers quadrature baseband signals manifested in having a spreaded spectrum indicative of said DC offset provided by said first and second mixers.

DETAILED DESCIPTION OF THE FIGURES

Figure 1:
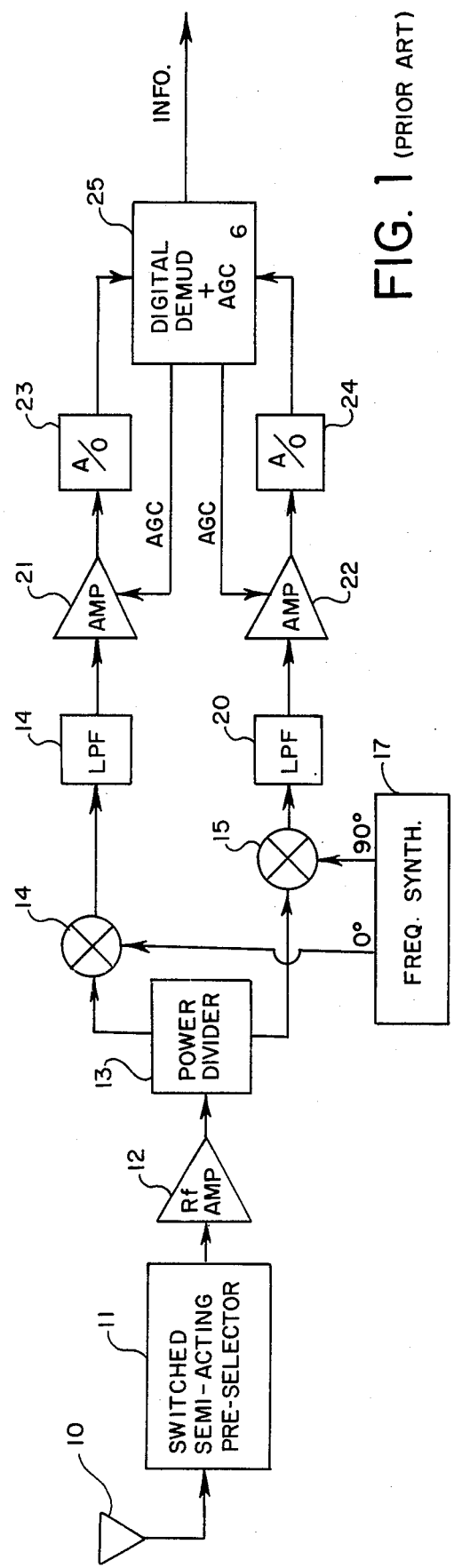
FIG. 1 is a block diagram of a typical prior art zero IF receiver.

Before proceeding with an explanation of the present invention and the description thereof, reference is made to FIG. 1 which shows a typical prior art zero IF receiver. As indicated, the conventional zero IF type receiver possesses unique advantages with respect to ordinary superheterodyne receivers. There are improvements in performance, size, and flexibility which are realized and there are also some disadvantages which are primarily concerned with the DC offsets at the output of the various mixers.

Referring to FIG. 1, there is shown a conventional zero IF receiver. Essentially, the receiver employs a switched semi-octave preselector 11 which has its input coupled to an antenna 10. The antenna 10 receives input RF signals which are directed to the preselector, amplified by means of RF amplifier 12 and applied to a power divider 13. A power divider 13 provides two outputs which are directed to respective inputs of quadrature mixers 14 and 15. The mixers 14 and 15 receive their other inputs from a frequency synthesizer 17 which is capable of being tuned or controlled over a wideband of frequencies. The outputs of mixers 14 and 15 are directed to lowpass filters 19 and 20 which are designated as channel filters. The outputs of the filters are coupled to amplifiers 21 and 22 whose outputs are coupled directly to analog-to-digital converters as 23 and 24 to thereby convert the incoming analog signal into a digital signal.

The outputs of the analog-to-digital converters are applied directly to a digital demodulator and AGC generator circuit 25 which produces AGC signals for amplifiers such as 21 and 22 as well as an AGC signal for the RF amplifier 12. The digital demodulator AGC generator 25 thereby has an output which essentially is the demodulated information impressed upon the original RF carrier.

As one can ascertain, many examples of such prior art receivers are shown in the above-noted patents. Thus as one can see, input RF signals which are received by the receiver are amplified and converted directly to baseband by the quadrature mixers as 14 and 15. The channel filters as 19 and 20 following the mixers provide all of the selectivity at the baseband frequency. If many different signal bandwidths must be handled, these channel filters are usually bandwidth programmable. The filtered output signals are then amplified by the low noise baseband amplifiers as 21 and 22 and then provided to the analog-to-digital converters as 23 and 24. Thus as one can understand, the zero IF architecture solves the problem of IF selection since any received signal regardless of the frequency is converted to baseband directly. There is no problem with image response since the image frequency overlaps the desired response.

From the standpoint of hardware simplicity, the zero IF is also attractive since there is a single conversion process and only one set of filters following the mixers is required. This means that there is good expectation that the architecture is implemented and can be implemented using a large percentage of monolithic integrated circuits. As indicated above, a major difficulty which arises with the zero IF architecture revolves around the DC offsets which are present at the output of the quadrature mixers. These offsets on the order or millivolts in the presence of generally much smaller desired signals which are on the order of microvolts cause the low noise baseband amplifiers as for example amplifiers 21 and 22 to saturate before the desired signals are amplified sufficiently to interface with the analog-to-digital converters. One potential method, as indicated, of overcoming this problem is to AC couple the output of the channel filter in the baseband amplifier. This produces the typical problems as indicated above and described above.

In any event, since a zero IF receiver directly translates the incoming RF signal to baseband in a single conversion, DC offsets at the output of the mixers are either inband or close to inband depending upon the modulation type. The DC offsets arise due to RF leakage between the RF and local oscillator ports of the mixer causing either the RF or local oscillator signal to mix with itself. The evaluation of numerous mixers has demonstrated that the offsets are porportional to the port-to-port isolation of the mixers.

Therefore, the first step towards handling the offsets consists of handling high isolation mixers. Presently, good passive mixers demonstrate at least 60 DB of isolation across a wideband of operating frequencies. In any event, this invention describes a technique to further reduce the effect of the offsets, and in order to understand the technique, reference is made to FIG. 2.

Figure 2:
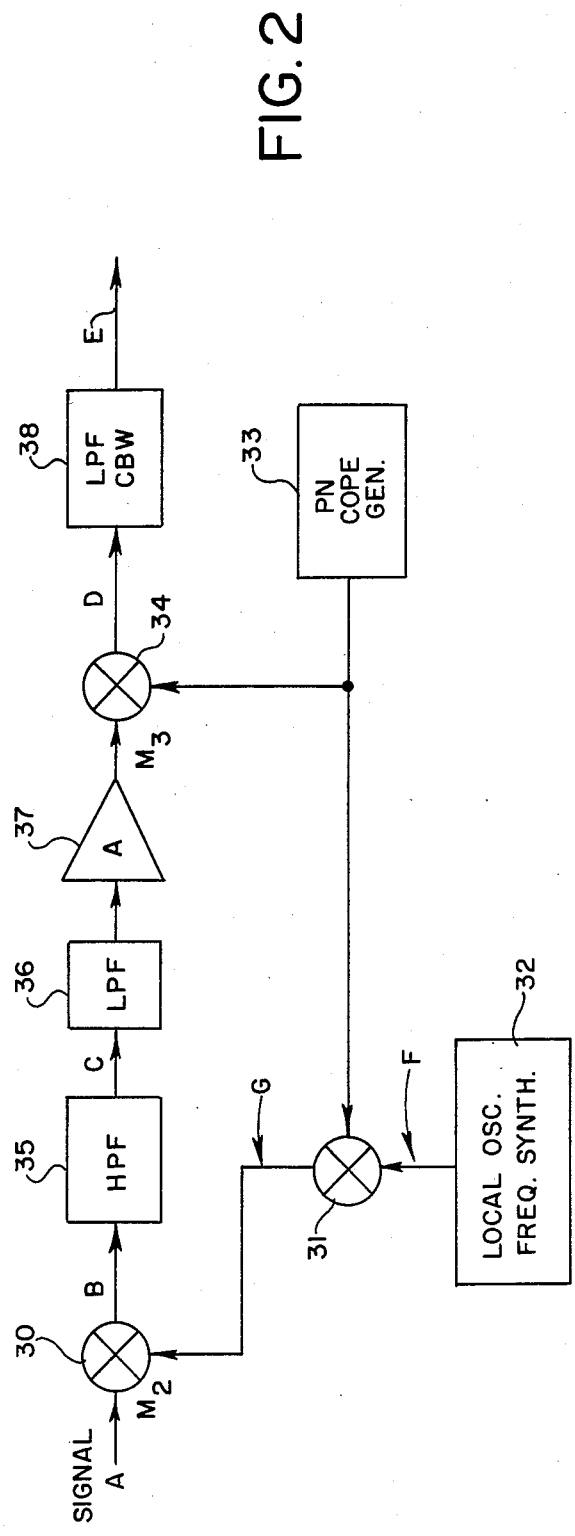
FIG. 2 is a simple block diagram showing a zero IF receiver apparatus according to this invention.

FIG. 2 depicts a simple block diagram of a technique for reducing the offset and essentially relates to one channel in regard to a zero IF receiver. An incoming signal designated by A is applied to the input of the mixer 30. The mixer 30 is a quadrature mixer and receives another input from a second mixer 31 which mixer 31 is associated with the local oscillator or frequency synthesizer 32. As seen, mixer 31 receives an input from a PN code generator 33. The term PN stands for pseudo-random-noise generator. The output from pseudo-random-noise generator 33 is applied to an input of mixer 31 and to an input of mixer 34.

As seen from FIG. 2, the output of mixer 30 is applied to a high pass filter 35 whose output is coupled to a lowpass filter 36 having an output coupled to amplifier 37 where amplifier 37 has its output coupled to the other input of mixer 34. The output of mixer 34 is then applied to the input of a lowpass filter 38. The lowpass filter 38, as will be explained, determines the channel bandwidth.

Figure 3A:
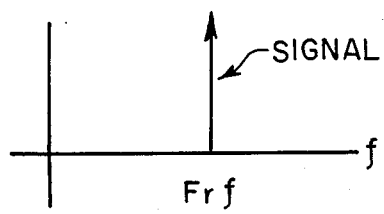
FIGS. 3A-3G are a series of diagrams showing the various waveforms of operation in regard to the circuitry of FIG. 2.
Figure 3B:
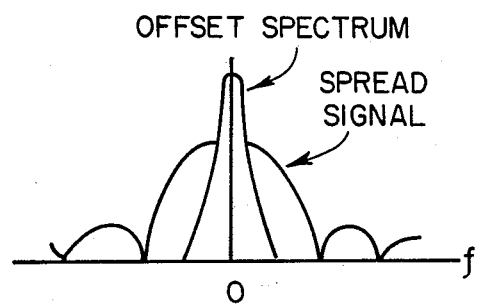
Figure 3C:
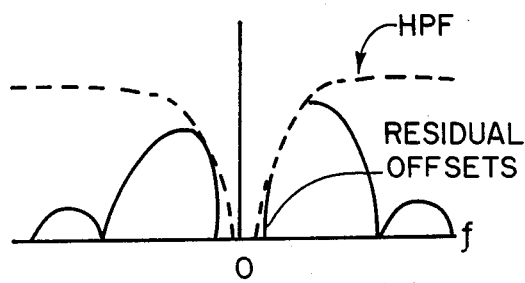
Figure 3D:
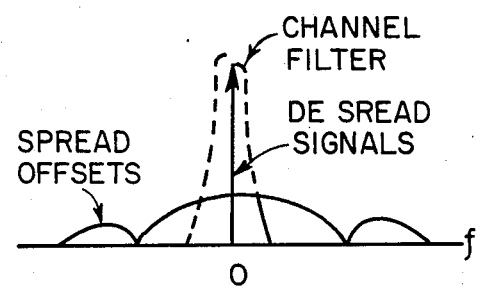
Figure 3E:
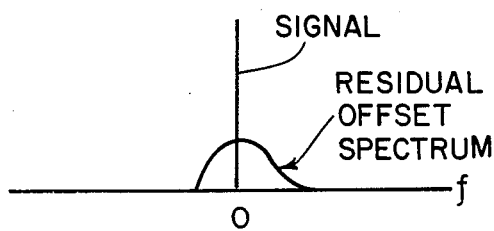
Figure 3F:
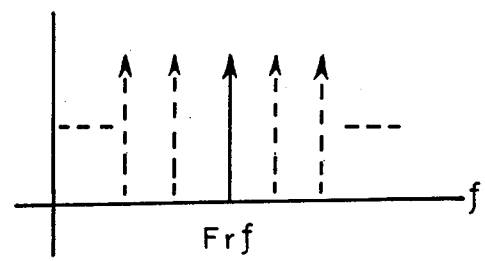
Figure 3G:
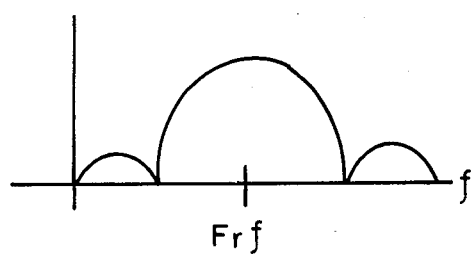

As seen in FIG. 2, there are various letters such as A, B, C, D, E, F and G which are shown at various circuit points. The frequency diagrams at each of the points are shown in FIGS. 3A to 3G. Whereby reviewing FIGS. 3A to 3G, one can understand how the circuit operates. Essentially, the output from the PN code generator 33 is mixed with the output of the frequency synthesizer at mixer 31 causing its spectrum to be spread over a much larger bandwidth. For example, the bandwidth increase would be 5 MHZ. When the output G which is the spread oscillator signal is mixed with the signal spectrum via mixer 30, it causes the signal spectrum to be spread to a bandwidth of the local oscillator. This is shown in FIG. 3B. It is, of course, understood that this signal is narrow band with respect to the spreaded local oscillator spectrum. The offsets produced at the output of the mixer 30 are not affected by the PN coding and are narrow with respect to the spread signal bandwidth which is shown in FIG. 3B. The bandwidth of the offset spectrum is determined by the rate of frequency hopping in the frequency synthesizer whose output is shown in FIG. 3F. The dashed lines indicating the amount of frequency hopping. The bandwidth is also determined by the bandwidth of any jamming signal.

The output of the mixer 30 is applied to an input of the high pass filter 35 which has a cutoff frequency high enough to reject most of the offset power but low enough to pass most of the spread signal power. The output from the high pass filter 35 is shown in FIG. 3C. In a typical example, the bandwidth of the high pass filter would be 1.2 MHZ. The output from the high pass filter is then sent to a lowpass filter 36 which has a bandwidth large enough to pass the spread signal but small enough to reject far out of band interfering signals.

The typical low pass filter employed may have a bandwidth of 10 MHZ. The resulting baseband signal is then amplified by amplifier 37 and mixed with the identical PN code signal at mixer 34. This, of course, was the signal used to spread the spectrum originally. This mixing operation at mixer 34 causes the signal spectrum to be collapsed to its original narrow bandwidth and any residual offset spectrum not removed by the high pass filter is therefore spread out. This is shown in FIG. 3D. The narrow band channel filter 38 following the mixer then passes the signal of interest but rejects most of the residual power associated with the offsets.

The magnitude of offset suppression which can be obtained with this technique is determined by two factors. The first is equal to the ratio of the bandwidth of the PN code used to the bandwidth of the channel filter. For example, if a BPSK (bi-phase shift keyed) 10 MHZ PN code is used, it will have a sin X/X spectrum with a single sided baseband 3 DB bandwidth of 5 MHZ. If the channel filter is 5 KHZ then the suppression filter is 1,000 or 30 DB. The second factor contributing to offset suppression is DC notch filtering resulting from the highpass filter. The magnitude of the offset suppression which is obtained using this technique is a relatively complicated function and includes many factors including the pulse jammer characteristics, the rate of frequency hopping, the number of poles and the zeros in the DC notch, the notch bandwidth and so on.

Analysis of this technique using computer simulations has determined that offset suppression greater than 30 DB for a wide class of jammers is typical. Essentially, the techniques as indicated above, serve to keep the offsets as small as possible and to prevent the offsets from causing saturation in any of the receiver components up to and including the analog-to-digital converters. If offset suppression is adequate to prevent saturation but not sufficient to signal processing fidelity requirements, the possibility exists for further offset suppression using digital signal processing techniques implemented in software.

It is, of course, noted that an additional benefit of the design is that the low frequency noise present at the output of the RF baseband conversion mixers will be suppressed by this technique as well since the spectral characteristics of this noise is similar to the offset spectral characteristics.

Figure 4:
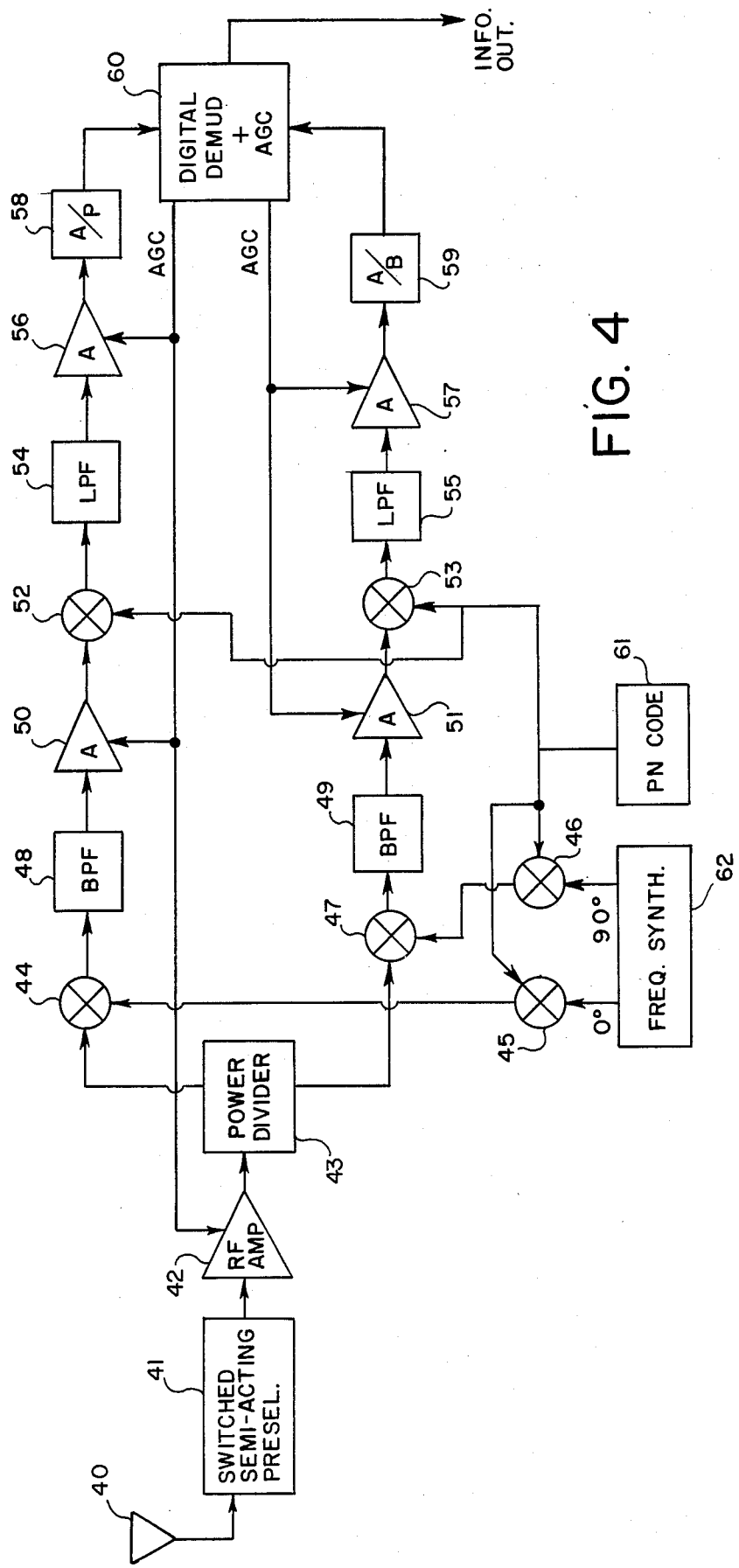
FIG. 4 is a detailed block diagram of an improved zero IF receiver according to this invention.

Referring to FIG. 4, there is shown a complete receiver using the above-noted design. As can be seen from FIG. 4, the receiver includes many of the components shown in the prior art receiver of FIG. 1 but essentially includes an additional mixer in each of the quadrature signal paths. As shown in FIG. 4, the PN code generator 61 has its input supplied to mixers 46, 45, 53 and 52. The outputs of mixers 45 and 46 are applied as inputs to mixers 44 and 47. The mixers 45 and 46 receive one input from the frequency synthesizer 62 and one input from the PN code generator 61. Essentially, as one can ascertain, the output from the PN code generator 61 is also applied to mixers 53 and 52 which thereby operate to cancel the spreading effects of the PN code generator 61 as for example did mixer 34 of FIG. 2. The outputs of mixers 53 are directed to the lowpass filters 54 and 55 and then are conventionally directed to amplifiers 56 and 57 which have their outputs coupled to the analog-to-digital converters 58 and 59 for eventual application to the digital demodulated AGC circuit module 60.

Although there is an additional mixer in each of the quadrature signal paths, these mixers operate more like phase detectors at baseband. The additional high pass and low pass filters can actually be combined into a single bandpass filter. As one can ascertain, the term psuedo-random essentially means that the noise basically is derived from a controlled source and is not a random process. A random process is often defined as an index family of random variables where the index or parameter T belongs to some set. These techniques concerning a pseudo-random noise source are well known as well as the random processing techniques and examples of many sources of such noise signals can be had by referring to various standard textbooks.

It is, of course, the object of utilizing this particular pseudo-random noise code generator to implement a spreading of the spectrum and then to utilize the same exact generator to reduce the spectrum back to its original frequency limitations.

What is claimed is:

1. A zero IF receiver apparatus for receiving an RF signal and providing an amplified version of said signal to be applied to a first and a second quadrature channel, said receiver including a local oscillator source for converting said RF signal in each channel to a baseband signal, comprising:
    first and second mixers each having one input adapted to receive said amplified RF signal, and each having a second input and an output, said mixers undesirably exhibiting an interfering DC offset,
    a pseudo-random phase code source for providing at an output a pseudo-random phase signal,
    third and fourth mixers each having one input coupled to the output of said pseudo-random phase code source and a second input coupled to the output of said local oscillator source wherein said third mixer receives at its input said local oscillator signal at a phase shift of 90° from said fourth mixer local oscillator signal, with the output of said third mixer coupled to the second input of said first mixer, and the output of said fourth mixer coupled to the second input of said second mixer,
    first and second filter means with said first filter means having an input coupled to the output of said first mixer and said second filter means hvaing an input coupled to the output of said second mixer,
    fifth and sixth mixers with said fifth mixer having a first input coupled to the output of said first filter means and a second input coupled to said pseudo-random phase code source, with said sixth mixer having a first input coupled to the output of said second filter means and a second input coupled to said pseudo-random phase code source to provide at the outputs of said fifth and sixth mixers quadrature baseband signals manifested in having a spreaded spectrum indicative of said DC offset provided by said first and second mixers.

2. The zero IF receiver apparatus according to claim 1, wherein said first and second filter means includes first and second bandpass filters.

3. The zero IF receiver apparatus according to claim 1, wherein said first and second filter means includes a high pass filter of a given bandwidth followed by a low pass filter of a given bandwidth.

4. The zero IF receiver apparatus according to claim 1, wherein said pseudo-random phase code source provides a phase signal having a sin X/X spectrum.

5. The zero IF receiver according to claim 4, wherein said pseudo-random phase code source is a bi-phase shift keyed code (BPSK).

6. The zero IF receiver according to claim 1, further including:
    first and second low pass filters with said first low pass filter having an input coupled to the output of said fifth mixer and with said second low pass filter having an input coupled to the output of said sixth mixer, with the output of said first low pass filter coupled to the input of a first analog to digital converter, and with the output of said second low pass filter coupled to the input of a second analog-to-digital converter.

7. The zero IF receiver according to claim 1, wherein said local oscillator is a frequency synthesizer.

8. The zero IF receiver according to claim 1, wherein said spreaded spectrum serves to suppress said offset by greater than 30 DB.

9. The zero IF receiver according to claim 6, wherein the bandwidth of said low pass filter is 5 KHZ.

10. The zero IF receiver according to claim 1, wherein said first and second mixer receives said RF signal via a power divider having first and second outputs with the first output of said divider coupled to said one input of said first mixer and with the second output of said divider coupled to said one input of said second mixer, said divider having an input coupled to the output of an RF amplifier.

* * * * *